(12) United States Patent
Mickan et al.

(10) Patent No.: US 7,463,336 B2
(45) Date of Patent: Dec. 9, 2008

(54) DEVICE MANUFACTURING METHOD AND APPARATUS WITH APPLIED ELECTRIC FIELD

(75) Inventors: Uwe Mickan, Veldhoven (DE); Antonius Johannes Josephus Van Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 597 days.

(21) Appl. No.: 10/823,775

(22) Filed: Apr. 14, 2004

(65) Prior Publication Data

US 2005/0231704 A1  Oct. 20, 2005

(51) Int. Cl.
*G03B 27/58* (2006.01)
*G02B 27/42* (2006.01)

(52) U.S. Cl. .......................... 355/72; 355/53
(58) Field of Classification Search ............ 355/72, 355/53; 369/101; 250/492.24; 430/30, 327, 430/326, 323; 313/504; 257/347; 118/50
See application file for complete search history.

(56) References Cited

U.S. PATENT DOCUMENTS

| | | | | |
|---|---|---|---|---|
| 5,258,266 | A * | 11/1993 | Tokui et al. ................. | 430/326 |
| 5,948,219 | A * | 9/1999 | Rohner .................... | 204/224 R |
| 6,307,826 | B1 * | 10/2001 | Katsumura et al. .......... | 369/101 |
| 6,319,643 | B1 * | 11/2001 | Singh et al. ................... | 430/30 |
| 6,459,472 | B1 | 10/2002 | De Jager et al. | |
| 6,482,558 | B1 * | 11/2002 | Singh et al. ................... | 430/30 |
| 2003/0001493 | A1 * | 1/2003 | Park .......................... | 313/504 |
| 2003/0008246 | A1 * | 1/2003 | Cheng et al. ................ | 430/323 |
| 2004/0013956 | A1 * | 1/2004 | Sogard ......................... | 430/30 |
| 2004/0134420 | A1 * | 7/2004 | Lei ............................... | 118/50 |
| 2004/0256579 | A1 * | 12/2004 | Viscor et al. .......... | 250/492.24 |
| 2005/0074706 | A1 * | 4/2005 | Bristol et al. ............... | 430/327 |
| 2005/0225734 | A1 * | 10/2005 | De Smit et al. .............. | 355/30 |
| 2006/0220126 | A1 * | 10/2006 | Huisman et al. ............ | 257/347 |

FOREIGN PATENT DOCUMENTS

| | | |
|---|---|---|
| JP | 63-244622 A | 10/1988 |
| JP | 1-158729 A | 6/1989 |
| JP | 4-166947 A | 6/1992 |
| JP | 4-258110 A | 9/1992 |

OTHER PUBLICATIONS

David T. Attwood, *Soft X-Rays and Extreme Ultraviolet Radiation: Principles and Applications*, Cambridge University Press, 1999 (the whole book).

P.W.H. de Jager, *Design of 'the Fancier': An Instrument for Fabrication and Analysis of Nanostructures Combining Ion and Electron Regulation*, Delft University Press, 1997, 338 pgs.

\* cited by examiner

*Primary Examiner*—Peter B Kim
(74) *Attorney, Agent, or Firm*—Sterne, Kessler, Goldstein & Fox P.L.L.C.

(57) ABSTRACT

A method of fabricating a device using a lithographic process, the method comprising applying a layer of radiation sensitive resist on top of the device, applying a metallic layer on top of the resist layer, and exposing a part of the resist layer to radiation while coupling the metallic layer to a fixed potential so as to apply an electric field across the resist layer, the direction of the electric field being substantially perpendicular to the plane of the resist layer.

19 Claims, 6 Drawing Sheets

DEVICE MANUFACTURING METHOD AND APPARATUS WITH APPLIED ELECTRIC FIELD

BACKGROUND OF THE INVENTION

1. Field of the Invention

The present invention relates generally to a device manufacturing method using lithography.

2. Description of the Prior Art

A lithographic apparatus is a machine that applies a desired pattern onto a target portion of a substrate. Lithographic apparatus can be used, for example, in the manufacture of integrated circuits (ICs). In that circumstance, a patterning means, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

An illumination system is provided for receiving a beam of radiation from a radiation source and for supplying a conditioned beam of radiation, referred to as the projection beam, having a desired uniformity and intensity distribution in its cross-section for illuminating a reticle and for patterning with the reticle. The source and the lithographic apparatus may be separate entities, for example when the source is a plasma discharge source. In such cases, the source is not considered to form part of the lithographic apparatus and the radiation beam is generally passed from the source to the illumination system with the aid of a radiation collector comprising, for example, suitable collecting mirrors and/or a spectral purity filter. In other cases the source may be an integral part of the apparatus, for example when the source is a mercury lamp.

The resolution with which a mask pattern can be replicated into a layer of resist is dependent upon a number of factors. Chief amongst these factors is the wavelength of the illuminating radiation. Diffraction occurring at the mask will tend to reduce the resolution of the illuminating pattern. This reduction in resolution will be less for radiation of relatively short wavelength. Much research has therefore gone into producing systems which operate at lower and lower wavelengths. A present goal is to provide systems which operate in the so-called "extreme" UV range, that is at wavelengths of less than 50 nm, e.g., 13.4 nm or 11 nm. It is noted that EUV radiation is readily absorbed by resist material and therefore processing making use of EUV must operate with extremely thin resist layers, typically on the order of 100 nm.

As the wavelength of the radiation gets smaller, so the energy of photons impinging on the resist increase giving rise to an increase in the production, within the resist, of secondary electrons. Indeed, as at EUV wavelengths the photon energy no longer matches the binding energy between resist molecules, it is the secondary electrons which provide the main mechanism for exposing the resist. Some background information is helpful in understanding this phenomenon and also why secondary electrons can reduce the mask transfer resolution.

During exposure of a resist layer, photons impinging on the resist are absorbed by electrons bound within atoms of the resist, imparting sufficient energy to these electrons to allow them to escape from their respective atomic shells. Vacancies arise in certain of the atomic shells of the atoms. This process is known as "photoionisation", and the freed electrons are referred to as "photoelectrons." Important parameters in defining the extent of the region exposed are:

the mean free path of photons, determined by absorbance in the resist;
  the energy levels at the different shells of the atoms;
  the atom density of the resist; and
  the angle distribution of the emitted photoelectrons.

When an electron moves to fill the vacancy left by a photoelectron, a photon will be emitted with energy defined by the valence band difference between the old and the new state. This process is a form of fluorescent emission. Hence, further parameters defining the extent of the region exposed are:

available transitions (energy differences) between shells;
  the probability that transfer will occur; and
  the angle distribution of the fluorescent emission.

When a photoelectron, collides with a bound electron, the impulse may be strong enough to knock out the bound electron to provide a "secondary" electron. The electron will travel in a new direction with reduced energy. Consequently, additional parameters defining the extent of the region exposed are:

electron density;
  the probability of scattering/impulse transfer;
  the angle distribution of the scattered primary electrons;
  the angle distribution of the generated secondary electron;
  the mean free path of both types of electrons (in principal, a reduction in electron energy causes the mean free path to increase, e.g., to around 5 nm for 5 eV~248 nm).

For a more detailed explanation of this theory see: David T. Attwood, Soft x-rays and extreme ultraviolet radiation: principles and applications, Cambridge University Press, 1999 (ISBN 0 521 65214 6), and P. W. H de Jager, An instrument for Fabrication and Analysis of Nanostructures Combining Ion and Electron Regulation, Delft University Press, 1997 (ISBN 90 407 1478 9).

FIG. 1 illustrates schematically the various processes outlined above. As shown, the energy which gives rise to the actual exposure of the resist can result from any one of these processes, and in particular as a result of secondary electron generation. Having regard to a diffraction limited image of a point source, the mean free path of the secondary electrons forms a radius within which photo-chemical effects establish effective exposure of the resist. This radius limits the lowest achievable resolution. The minimum line edge roughness (LER) of any feature is defined, to a first order, by the random generated path of scattered secondary electrons through the resist and the randomized distribution of photons. The LER can be visualized as the envelope of a series of circles (having a radius equal to the random generated path of scattered secondary electrons) centered on a line with the edges of the circles just touching. In addition, the centers of the circles is statistically defined and depends upon the atom density within the resist. This is illustrated in FIG. 2.

As well as adversely affecting the exposure resolution, secondary electrons can also result in damage to layers of an integrated circuit beneath the resist layer. Two scenarios are conceivable:

the voltage of the secondary electrons collected together in the resist layer gives rise to a voltage which leads to damage; and the secondary electrons travel into a sensitive layer and damage bindings or structures within that layer.

The collection of electrons within the resist layer may also adversely affect small structures located in the vicinity of large exposed areas or structures. The desired critical dimensions (that is the smallest space between two features of a pattern, such as, for example, lines or contacts, permitted in the fabrication of a device layer and/or the smallest width of a line or any other feature) might also be changed.

SUMMARY OF THE INVENTION

According to a first aspect of the present invention there is provided a method of fabricating a device using a lithographic process, including, applying a radiation sensitive resist on top of the device, and exposing a part of the resist to radiation while applying an electric field across the resist, the direction of said field being substantially perpendicular to the plane of the resist layer.

Fabrication methods embodying the present invention tend to prevent secondary electrons from migrating out of exposed areas of the resist into unexposed areas, thus improving the resolution of the process. Similarly, electron migration out of the resist into lower layers of the device can be prevented or reduced.

In a first embodiment of the invention, the method includes applying a layer of conductive material to an upper surface of the resist. The electric field is applied during exposure by, for example, connecting the layer of conductive material to a fixed potential. The conductive material may be metallic, being at least substantially transparent to the exposing radiation. One possible conductive material is indium tin oxide.

The thickness of the conducting layer should be sufficiently thin to provide only minimal attenuation of the transmitted light, e.g., <10%, preferably around 2% or less. The layer may be applied to a thickness of less than 50 nm, e.g., around 10 nm.

In an alternative embodiment, the method comprises providing a layer of conductive material on a lower surface of the resist, between the resist and the surface of the device. Said electric field is applied during exposure by for example connecting the layer of conductive material to a fixed potential. The conductive material may be metallic, for example indium tin oxide.

In yet another embodiment, the method comprising applying a layer of conductive material to an upper surface of the resist and providing a layer of conductive material on a lower surface of the resist, between the resist and the surface of the device, and applying said electric field during exposure by applying a potential difference between the two conducting layers.

In yet another embodiment, the electric field is applied by directly coupling the resist to a fixed potential. For example, a probe connected to a fixed potential may be brought into contact with the resist shortly before exposure begins. Preferably, a conducting material is incorporated into the resist.

According to a second aspect of the present invention there is provided a lithographic apparatus including, an illumination system for providing a projection beam of radiation, a support structure for supporting a patterning device for imparting a pattern to the projection beam, a substrate table for holding a substrate, a projection system for projecting the patterned beam onto a target portion of the substrate, and an electric field generator for causing an electric field to be applied across a resist layer provided on a surface of the substrate, the direction of the field being substantially perpendicular to the plane of the resist layer.

According to a third aspect of the present invention there is provided a method of fabricating a device using a lithographic process including, applying a radiation sensitive resist on top of the device, the resist material incorporating a conductive material, and exposing a part of the resist to radiation while applying an electric field across the resist.

BRIEF DESCRIPTION OF THE DRAWINGS

For a better understanding of the present invention and in order to show how the same may be carried into effect, reference will now be made, by way of example, to the accompanying drawings, in which.

DETAILED DESCRIPTION OF THE PREFERRED EMBODIMENTS

While the following description refers to specific embodiments of the invention, it will be appreciated that the invention may be practiced otherwise than as described below. The description is not intended to limit the invention.

Figure 1:
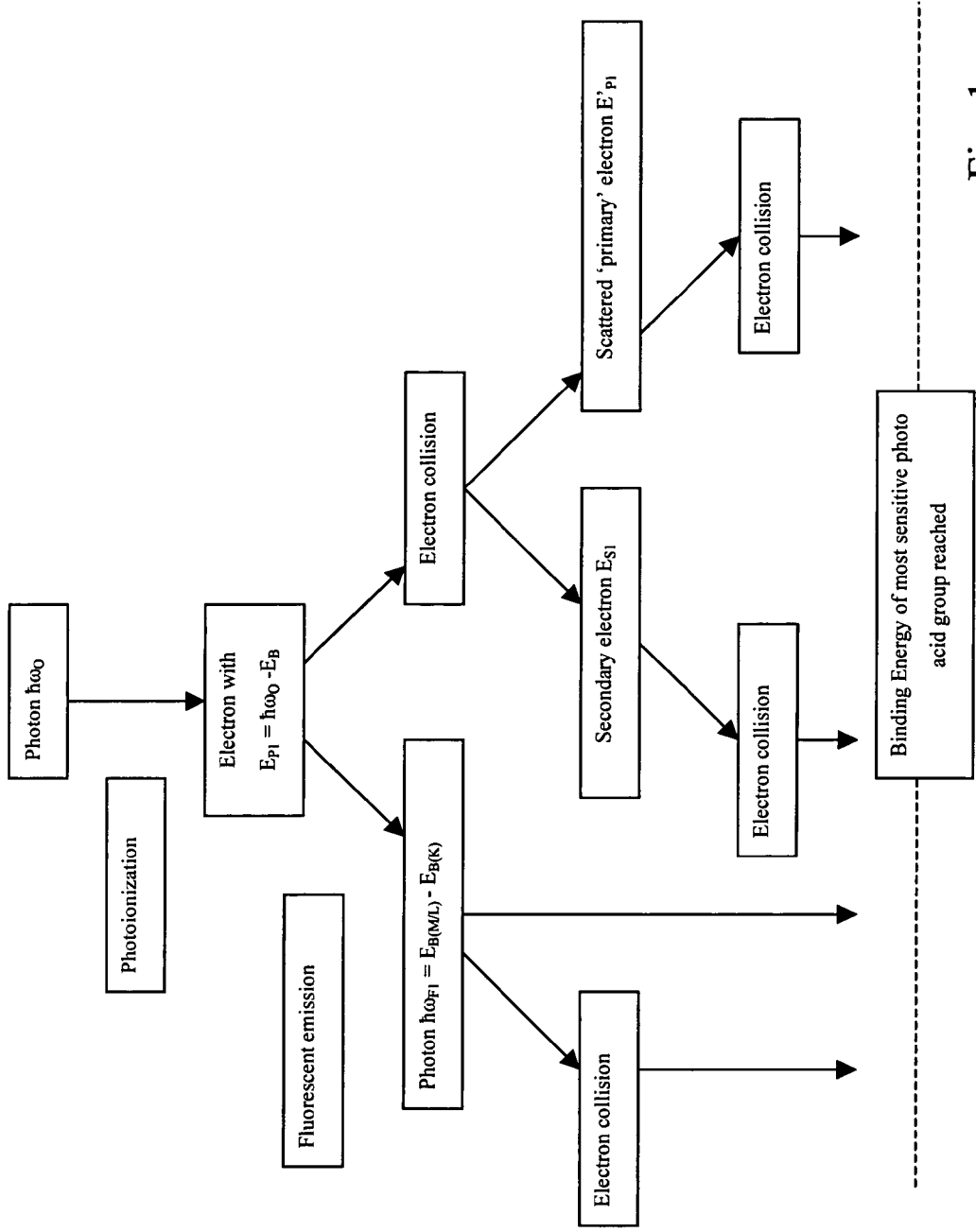
FIG. 1 illustrates a secondary electron generation mechanism in a photo resist.
Figure 2:
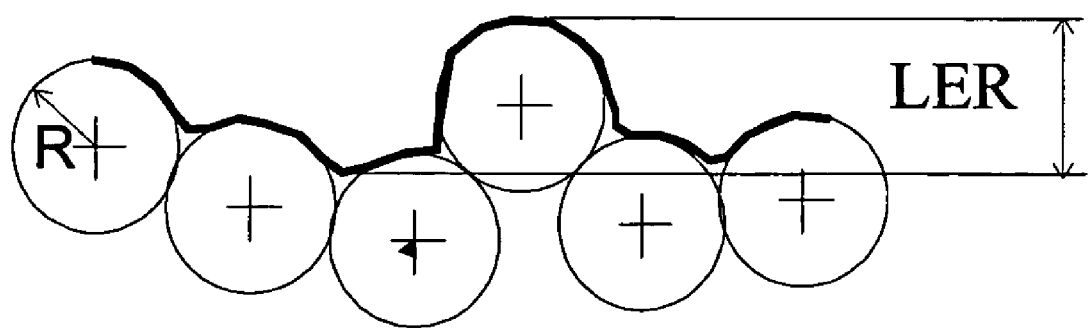
FIG. 2 illustrates diagrammatically the limitations on line edge roughness in a photolithographic process.
Figure 3:
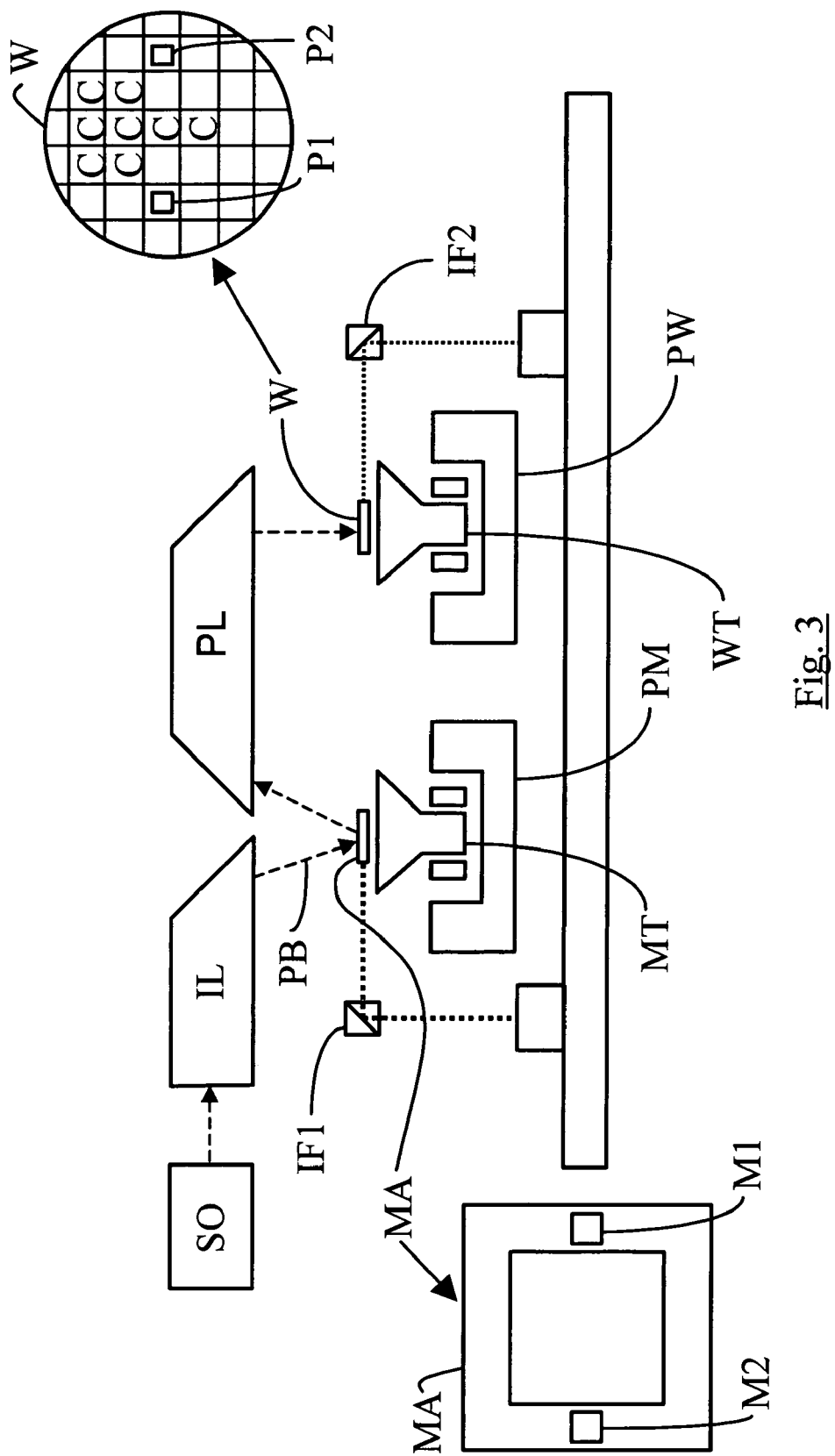
FIG. 3 diagrammatically shows a typical lithographic apparatus.

FIG. 3 schematically depicts a typical lithographic apparatus. The apparatus comprises:

- an illumination system IL for providing a projection beam PB of radiation (e.g., UV or EUV radiation);
- a first support structure (e.g., a mask table) MT for supporting a patterning device (e.g., a mask) MA and connected to first positioner PM for accurately positioning the patterning device with respect to item PL;
- a substrate table (e.g., a wafer table) WT for holding a substrate (e.g., a resist-coated wafer) W and connected to second positioner PW for accurately positioning the substrate with respect to item PL; and
- a projection system (e.g., a reflective projection lens) PL for imaging a pattern imparted to the projection beam PB by patterning device MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illumination system IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illumination system IL with the aid of a radiation collector comprising for example suitable collecting mirrors and/or a spectral purity filter. In other cases the source may be integral part of the apparatus, for example when the source is a mercury lamp. The source SO and the illumination system IL may be referred to as a radiation system.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g., an interferometric device), the substrate table WT can be moved accurately, e.g., so as to position different target portions C in the path of the beam PB. Similarly, the first positioner PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

Figure 4A:
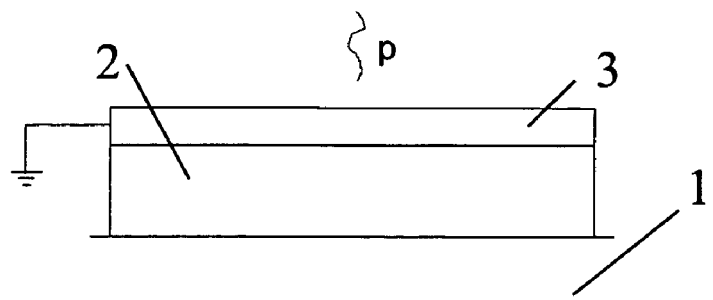
FIGS. 4a to 4c illustrate various procedures for improving resolution in the apparatus of FIG. 1.

A pre-prepared wafer 1 is illustrated in FIG. 4a. A thin, uniform coating 2 of a photo-sensitive resist is provided over an upper surface of the wafer. The resist layer may have a thickness of the order of 100 nm. Typically, the resist layer 2 is produced by spinning the wafer at high speed and placing a drop or drops of resist onto the wafer surface. The spun resist is then baked at high temperature. A thin coating 3 of a conductive material is provided over the surface of the resist layer 2. Preferably, the conductive material is transparent to light (at the exposing wavelength). One such material is indium tin oxide. However, provided the conductive layer 3 is thin enough to allow sufficient light to be transmitted to the resist layer 2, this is not essential. A typical thickness might be 10 nm which would give rise to a light transmission loss of only around 2%. The conductive layer 3 may be produced, for example, by evaporation or sputtering.

Figure 4B:
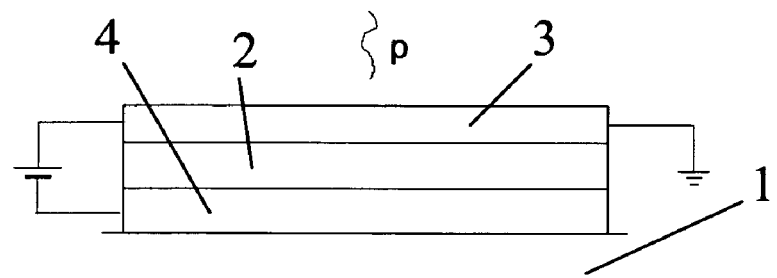

FIG. 4b illustrates an alternative pre-prepared wafer arrangement, in which a second layer of conductive material 4 is provided between the resist layer 2 and the surface of the wafer 1. As this layer is not required to transmit light, the properties of the material used and of the layer itself may be different from those of the upper conductive layer 3.

Figure 4C:
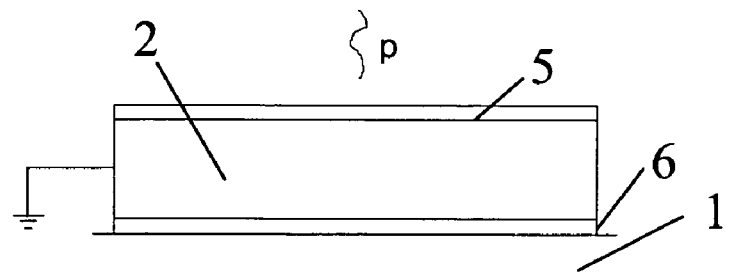

FIG. 4c illustrates another alternative pre-prepared wafer arrangement in which a conductive material is incorporated into the resist material providing the resist layer 2. This conductive material may be, for example, Silicon. A further coating 5 is provided on the surface of the resist. This coating is preferably formed of AlN (aluminum nitride), Ru, Ir, Au, SiN, Rh, Si or C, and provides the lithographic apparatus with outgassing protection. This is explained further below. A barrier layer 6 is additionally provided on the surface of the wafer 1, between the wafer 1 and the resist layer 2. This layer 6 helps prevent the migration of conducting ions into the wafer from the resist layer, which might otherwise arise and cause damage to the wafer.

Following preparation of a pre-prepared wafer, the wafer is introduced into the apparatus of FIG. 3 and is positioned on the substrate table WT in correct alignment with the projection system PL. In the case of the wafer illustrated in FIG. 4a, a probe is brought into conducting contact with the conducting layer 3. The probe is connected to ground potential, thus connecting the conducting layer 3 to ground. The wafer is then illuminated with the appropriate light pattern. It will be appreciated that free electrons generated during the exposure step, including secondary electrons, will tend to move in a direction towards the grounded layer 3. In other words, electrons will tend not to move in the horizontal plane (with reference to FIG. 4a) thus reducing the exposure of unilluminated areas.

Figure 5:
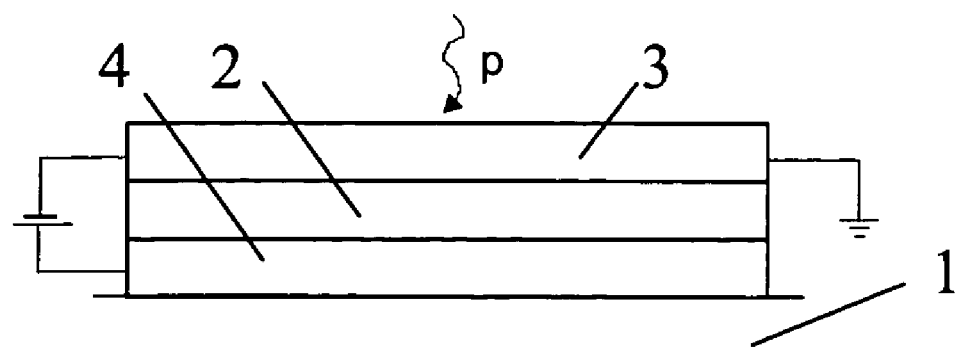
FIG. 5 is a flow diagram illustrating selected process steps in the fabrication of an integrated circuit.

With reference to the wafer of FIG. 4b, following alignment of the wafer with the projection system PL, conductive contact is made with both of the conducting layers 3,4. A static (DC) potential is applied between the two layers such that the upper layer 3 is at a positive potential relative to the lower layer 4. Again, this has the effect of urging free electrons to move towards the upper layer 3, inhibiting lateral movement. In an alternative arrangement, the polarity of the potential is reversed as illustrated in FIG. 5. This has the effect of accelerating free electrons towards the wafer surface, effectively increasing the sensitivity of the resist.

With reference to the wafer of FIG. 4c, conducting contact is made with the resist layer 2, to allow that layer to be coupled to ground.

Figure 6:
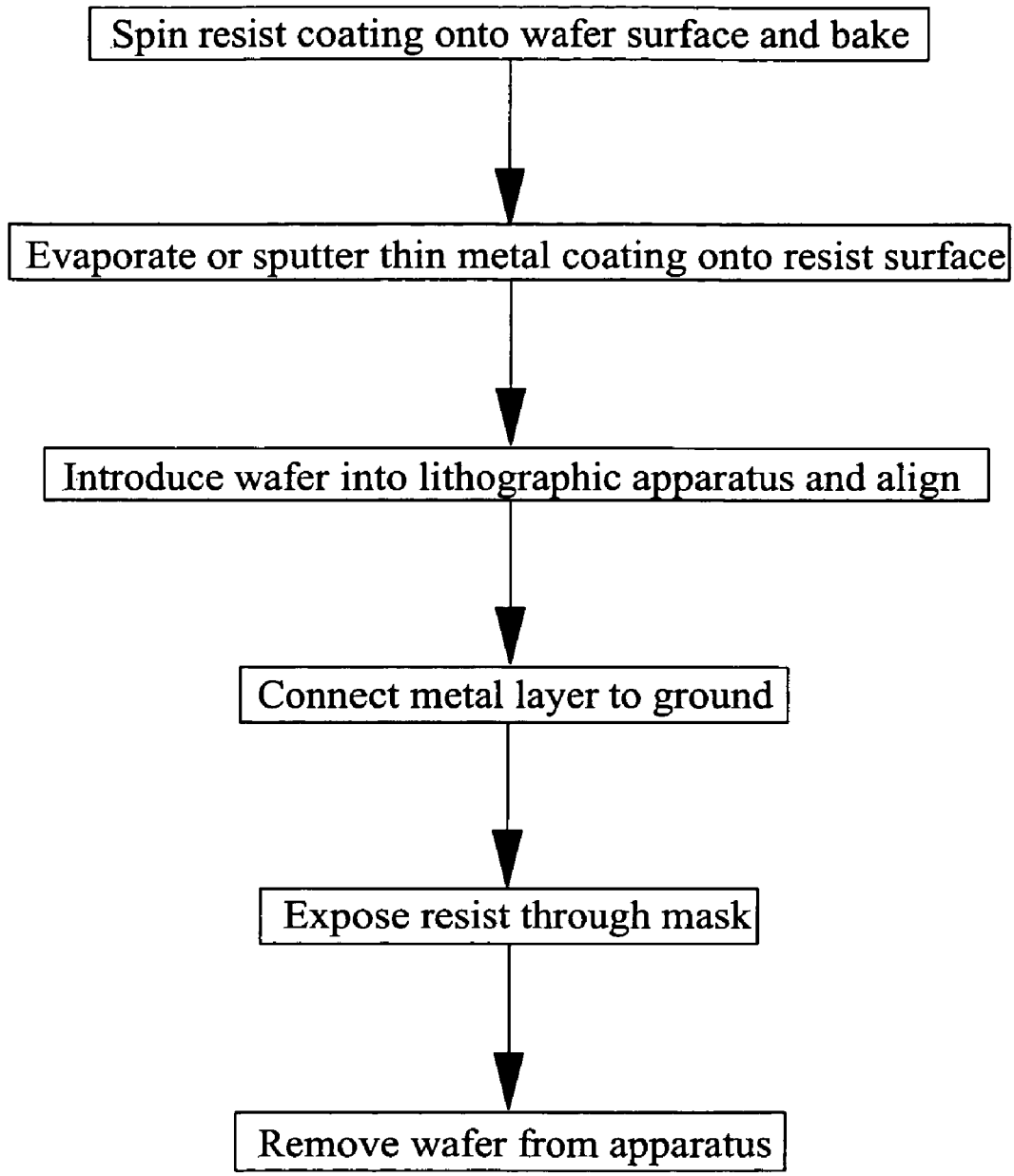
FIG. 6 illustrates an alternative procedure for improving resolution in the apparatus of FIG. 1.

FIG. 6 is a flow diagram illustrating the key steps in the device fabrication procedure.

It will be appreciated that coupling a probe to a conducting portion of the device (be it the resist or an additional conducting layer) may prove difficult in practice. A better solution may be to allow the conducting material to overlap the sides of the wafer, extending around the base of the wafer. By coupling the base to a fixed potential, an appropriate electric field can be applied across the resist layer 2.

The problem of degeneration of the optical components of lithographic apparatus when operating with EUV radiation has been considered in for example U.S. Pat. No. 6,459,472. This appears to arise from the outgassing of materials from the surface of the resist layer, forming a coating on the final optical component (mirror or lens). Particularly problematic are hydrocarbons and sulphur. It is anticipated that this problem will be mitigated significantly where the resist layer 2 is coated with a top layer which is dense enough to prevent outgassing from the resist. For example, the arrangement of FIGS. 4a and 4b (or 5) might be particularly appropriate. Where a conductive top layer is not provided as part of the means for reducing the effects of secondary electrons (e.g., FIG. 4c, where a conductive material is incorporated into the resist), an additional outgassing protection layer 5 is preferably added. This must of course be thin enough to avoid significant absorption of light within the outgassing protection layer.

Figure 7:
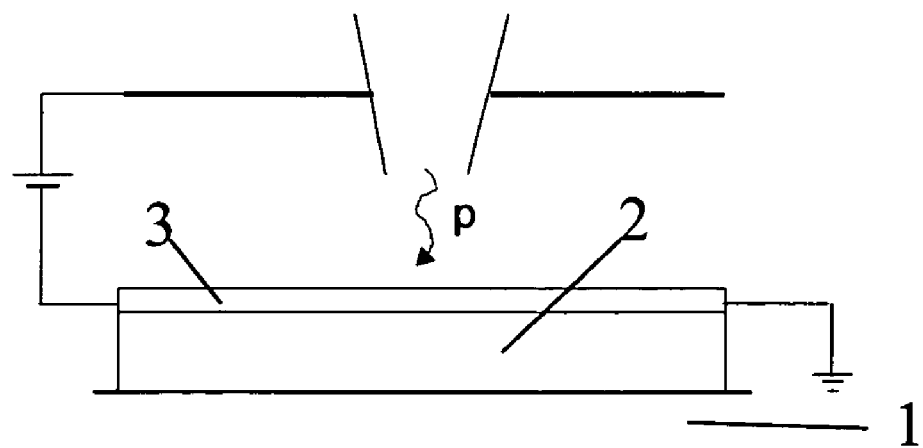
FIG. 7 illustrates a further alternative procedure for improving resolution in the apparatus of FIG. 1.

U.S. Pat. No. 6,459,472 presents a solution to the sputtering problem which requires the introduction of a channel containing argon gas between the final optical component of the lithographic apparatus and the surface of the wafer. Argon absorbs EUV to a much lesser extent than does air. The gas in the chamber is continuously flushed to remove any debris sputtered off the surface of the wafer. A potential problem with this approach is that argon atoms will be ionized to some extent by the illuminating radiation. Where a conducting layer on top of the resist is coupled to ground, the argon containing chamber may be connected to a positive potential. This is illustrated in FIG. 7. The arrangement will tend to cause ions outgassed from the resist material (which will tend to be positively charged) to be attracted towards the wafer, and away from the projection optics thus reducing the level of contamination suffered by the optics.

It will be appreciated by the person of skill in the art that various modifications may be made to the above described embodiments without departing from the scope of the present invention.

The invention claimed is:

1. A method of fabricating a device using a lithographic process, the method comprising:
   applying a first layer of conductive material to an upper surface of a resist layer on a substrate;
   providing a second layer of conductive material on a lower surface of the resist layer, between the resist layer and the substrate;
   exposing a part of the resist layer to ultraviolet radiation; and
   applying an electric field across the resist layer by applying a potential difference between the two conducting layers during the exposing, the direction of the field being substantially perpendicular to a plane of the resist layer.

2. A method according to claim 1, wherein said conductive material of at least one of the layers is metallic.

3. A method according to claim 2, further comprising applying said layer of conductive material to a thickness of less than 50 nm.

4. A method according to claim 1, wherein at least one of said layers of conductive material overlaps a side or base of the device.

5. A method according to claim 4, wherein both layers of conductive material overlap the side or base of the device.

6. A method according to claim 1, wherein said radiation is in the extreme ultra-violet range.

7. A method according to claim 1, further comprising orienting the electric field such that an upper surface of the resist layer is at a positive potential with respect to a lower surface.

8. A lithographic apparatus comprising:
   an illumination system configured to condition a projection beam of ultraviolet radiation;
   a support structure configured to support a patterning device to impart a pattern to the projection beam;
   a substrate table configured to hold a substrate having a resist layer;
   a projection system configured to project the patterned beam onto a target portion of the substrate; and
   an electric field generator configured and arranged to apply a potential difference between a layer of conductive material on an upper surface of the resist layer and a layer of conductive material on a lower surface of the resist layer, between the resist layer and the substrate, while the patterned beam is being projected, the direction of said field being substantially perpendicular to the plane of the resist layer.

9. The apparatus of claim 8, wherein the electric field generator is further configured to apply said electric field by connecting the layer of conductive material on the upper surface of the resist layer to a fixed potential.

10. The apparatus of claim 8, wherein said radiation is in the extreme ultra-violet range.

11. A method of fabricating a device using a lithographic process, comprising:
    applying a radiation sensitive resist on top of the device, the resist material incorporating a conductive material; and
    exposing a part of the resist to ultraviolet radiation while applying an electric field across the resist.

12. The method of claim 11, further comprising applying an electric field across the resist by directly coupling the resist to a fixed potential.

13. The method of claim 11, wherein said radiation is in the extreme ultra-violet range.

14. A method of processing a device using a lithographic process, said device comprising a radiation sensitive and conductive resist material, said method comprising:
    exposing the conductive resist material to UV radiation while applying an electric field across the resist material by directly coupling the conductive resist material to a fixed potential.

15. The method of claim 14, wherein said radiation is in the extreme ultra-violet range.

16. A method of fabricating a device using a lithographic process, the method comprising:
    applying a layer of metallic conductive material to an upper surface of a resist layer on a substrate;
    exposing a part of the resist layer to ultraviolet radiation; and
    applying an electric field across the resist layer during the exposing, the direction of the field being substantially perpendicular to a plane of the resist layer.

17. A method according to claim 16, wherein said electric field is applied by connecting said conductive layer to a fixed potential.

18. A method according to claim 16, further comprising applying said layer of conductive material to a thickness of less than 50 nm.

19. A method according to claim 16, wherein said layer of conductive material overlaps a side or base of the device.

* * * * *